US009142731B2

United States Patent
Petersen

(10) Patent No.: US 9,142,731 B2
(45) Date of Patent: Sep. 22, 2015

(54) METHOD FOR PRODUCING A LUMINESCENCE CONVERSION SUBSTANCE LAYER, A COMPOSITION THEREFOR AND A COMPONENT COMPRISING SUCH A LUMINESCENCE CONVERSION SUBSTANCE LAYER

(75) Inventor: Kirstin Petersen, Regensburg (DE)

(73) Assignee: OSRAM OPTO SEMICONDUCTORS GMBH, Regensburg (DE)

(*) Notice: Subject to any disclaimer, the term of this patent is extended or adjusted under 35 U.S.C. 154(b) by 0 days.

(21) Appl. No.: 13/877,296

(22) PCT Filed: Dec. 13, 2011

(86) PCT No.: PCT/EP2011/072627
§ 371 (c)(1),
(2), (4) Date: Jun. 26, 2013

(87) PCT Pub. No.: WO2012/080263
PCT Pub. Date: Jun. 21, 2012

(65) Prior Publication Data
US 2013/0267051 A1     Oct. 10, 2013

(30) Foreign Application Priority Data
Dec. 13, 2010   (DE) .................... 10 2010 054 280

(51) Int. Cl.
*H01L 21/00*     (2006.01)
*H01L 33/50*     (2010.01)
(Continued)

(52) U.S. Cl.
CPC .............. *H01L 33/502* (2013.01); *C09K 11/02* (2013.01); *C09K 11/08* (2013.01); *H01L 33/50* (2013.01);
(Continued)

(58) Field of Classification Search
CPC ................. H01L 2933/0041; H01L 33/502; H01L 27/322; H01L 51/5012; H01L 33/50; H01L 31/055; H01L 33/26
USPC ......... 257/E33.061, E33.001, 13; 438/29, 22, 438/35, 69
See application file for complete search history.

(56) References Cited

U.S. PATENT DOCUMENTS

| 5,508,337 A | 4/1996 | Wamprecht et al. |
| 6,604,971 B1 | 8/2003 | Sun et al. |

(Continued)

FOREIGN PATENT DOCUMENTS

| DE | 100 36 940 A1 | 2/2002 |
| DE | 101 47 040 A1 | 4/2003 |

(Continued)

OTHER PUBLICATIONS

Schnitzer, I., et al., "30% external quantum efficiency from surface textured, thin-film light-emitting diodes," Appl. Phys. Lett., No. 63, vol. 16, Oct. 18, 1993, pp. 2174-2176.

*Primary Examiner* — Bac Au
(74) *Attorney, Agent, or Firm* — Slater & Matsil, L.L.P.

(57) ABSTRACT

One embodiment of the invention describes a method for producing a luminescence conversion substance layer on a substrate with a semiconductor element that emits a primary radiation during operation. A composition includes a luminescence conversion substance, a matrix material and a solvent. The composition is applied to a substrate. At least part of the solvent is removed, with the result that the luminescence conversion substance layer is formed on the substrate.

15 Claims, 6 Drawing Sheets

(51) Int. Cl.
*C09K 11/02* (2006.01)
*C09K 11/08* (2006.01)

(52) U.S. Cl.
CPC ............ *H01L 33/501* (2013.01); *H01L 33/507* (2013.01); *H01L 33/508* (2013.01); *H01L 2924/0002* (2013.01); *H01L 2933/0041* (2013.01)

(56) References Cited

U.S. PATENT DOCUMENTS

| | | | |
|---|---|---|---|
| 6,616,862 B2 | 9/2003 | Srivastava et al. | |
| 6,635,363 B1 | 10/2003 | Duclos et al. | |
| 7,772,769 B2 | 8/2010 | Maeda et al. | |
| 7,960,909 B2 | 6/2011 | Amano et al. | |
| 8,058,088 B2* | 11/2011 | Cannon et al. | 438/48 |
| 2002/0030292 A1 | 3/2002 | Tasaki et al. | |
| 2003/0141810 A1* | 7/2003 | Kobayashi et al. | 313/504 |
| 2004/0062699 A1 | 4/2004 | Oshio | |
| 2004/0104391 A1 | 6/2004 | Maeda et al. | |
| 2005/0244993 A1 | 11/2005 | Bogner et al. | |
| 2006/0063289 A1 | 3/2006 | Negley et al. | |
| 2007/0001568 A1 | 1/2007 | Kaneko et al. | |
| 2007/0128745 A1 | 6/2007 | Brukilacchio et al. | |
| 2007/0134160 A1* | 6/2007 | Leif et al. | 424/9.6 |
| 2007/0148332 A1 | 6/2007 | Lee et al. | |
| 2007/0228932 A1* | 10/2007 | Amano et al. | 313/502 |
| 2008/0017875 A1* | 1/2008 | Lee et al. | 257/98 |
| 2009/0142876 A1 | 6/2009 | Tuan et al. | |
| 2009/0213296 A1 | 8/2009 | Park et al. | |
| 2010/0006880 A1 | 1/2010 | Wang et al. | |
| 2010/0193806 A1 | 8/2010 | Byun | |
| 2010/0237775 A1* | 9/2010 | Chao | 313/506 |
| 2011/0079816 A1* | 4/2011 | Fujioka et al. | 257/100 |

FOREIGN PATENT DOCUMENTS

| | | |
|---|---|---|
| JP | 2007250629 A | 9/2007 |
| JP | 2010226110 A | 10/2010 |
| KR | 100923804 B1 | 4/2004 |
| WO | WO 00/33390 A1 | 6/2000 |

* cited by examiner

METHOD FOR PRODUCING A LUMINESCENCE CONVERSION SUBSTANCE LAYER, A COMPOSITION THEREFOR AND A COMPONENT COMPRISING SUCH A LUMINESCENCE CONVERSION SUBSTANCE LAYER This patent application is a national phase filing under section 371 of PCT/EP2011/072627, filed Dec. 13, 2011, which claims the priority of German patent application 10 2010 054 280.6, filed Dec. 13, 2010, each of which is incorporated herein by reference in its entirety.

TECHNICAL FIELD

The invention relates to a method for producing a luminescence conversion substance layer, a composition used in the method, and a component comprising such a luminescence conversion substance layer.

BACKGROUND

In radiation-emitting components, luminescence conversion substances are often used in order to partly convert the radiation emitted by a radiation source into a radiation having a changed wavelength. In a radiation-emitting component, a uniform color impression of the emitted radiation and a high efficiency are generally desirable, for which reason the introduction of the luminescence conversion substance into the component is accorded a particular importance.

SUMMARY OF THE INVENTION

Embodiments of the invention provide a method for producing a luminescence conversion substance layer having improved properties.

Further embodiments specify a composition used in such a method, and a component comprising such a luminescence conversion substance layer having improved properties.

A method for producing a luminescence conversion substance layer on a substrate with a semiconductor element, which emits a primary radiation during operation is specified, and includes the following method steps:
 (a) providing the substrate;
 (b) providing a composition comprising a luminescence conversion substance, a matrix material and a solvent;
 (c) applying the composition to the substrate;
 (d) removing at least a part of the solvent, so that the luminescence conversion substance layer is formed on the substrate.

Method steps (a) and (b), in particular, can be carried out in any desired order or else simultaneously. Method steps (c) and (d) can, if appropriate, be effected simultaneously, but usually successively. The semiconductor element, which emits a primary radiation during operation, is also designated hereinafter as the "semiconductor element."

The luminescence conversion substance layer can be formed at least partly by sedimentation, that is, settling, of the luminescence conversion substance. For this purpose, some time can elapse between the application of the composition and the actual removal of the solvent. The removal of the solvent in method step (d) and/or the addition of the composition in method step (c) can also be carried out such that the luminescence conversion substance can at least partly sediment in the meantime. The luminescence conversion substance can sediment in the presence of the solvent and of the matrix material, even if there is already more matrix material present than solvent.

When applying the composition in method step (c) and/or when forming the luminescence conversion substance layer in method step (d), it is possible to avoid turbulent flows, as a result of which the luminescence conversion substance layer can be formed with improved uniformity on the substrate. This is facilitated by the solvent in the composition in comparison with conventional compositions without a solvent. Therefore, by way of example, heating the composition to a temperature above the ambient temperature, for example above 25° C., for application purposes can be dispensed with, so that the method is simplified.

The uniformity can be assessed by producing micrographs through the layer and the substrate or parts of the substrate, for example in cross section, and then analyzing them using a microscope or a scanning electron microscope (SEM). It is thereby possible to determine for example the degree and the gradient of the luminescence conversion substance settling, the density of the phosphor substance layer and density gradients.

The luminescence conversion substance layer formed in method step (d) can have a good adhesion in particular on the substrate or on the layer on which it is directly produced, with the result that neither an adhesive nor an adhesive layer is required. As a result, a work step for applying the adhesive and, of course, the adhesive per se can be obviated. Advantageously, the emission characteristic and the color homogeneity of a radiation-emitting component having such a luminescence conversion substance layer are also improved by this, since, in contrast to a conventional component, a transparent adhesive layer can function unintentionally as an optical waveguide, through which unconverted primary radiation could be coupled out.

During operation, the semiconductor element emits a primary radiation having a first wavelength, wherein the first wavelength specifies the spectrum of the primary radiation. The luminescence conversion substance converts the primary radiation at least partly into a secondary radiation having a second, longer wavelength. The second wavelength specifies the spectrum of the secondary radiation.

The selection of the semiconductor materials is not limited according to the invention. In particular, it is possible to use semiconductor materials, which emit a primary radiation in the visible range of the spectrum (420 to 780 nm wavelength) or in the UV range (200 to 420 nm wavelength).

The selection of the luminescence conversion substance is not limited according to the invention. Examples of such luminescence conversion substances and luminescence conversion substance mixtures are:
 chlorosilicates as disclosed, for example, in DE 10036940 and the prior art described therein,
 orthosilicates, sulphides, thiometals and vanadates as disclosed, for example, in WO 2000/33390 and the prior art described therein,
 aluminates, oxides, halophosphates as disclosed, for example, in U.S. Pat. No. 6,616,862 and the prior art described therein,
 nitrides, sions and sialons as disclosed, for example, in DE 10147040 and the prior art described therein, and
 garnets of the rare earths such as YAG:Ce and the alkaline earth metal elements as disclosed, for example, in U.S. Patent Publication No. 2004/062699 and the prior art described therein.

The luminescence conversion substance can also be a combination of different luminescence conversion substances.

The luminescence conversion substance can be present in particles, which can have, for example, a form that is spherical, platelet-shaped, polyhedral, amorphous, any other defined form and/or combinations of these forms. These particles at least partly consist of the luminescence conversion substance. In this respect, the disclosure content of the references is hereby incorporated by reference.

The luminescence conversion substance layer can be formed particularly uniformly on the substrate and in the beam path of the primary radiation. It is thereby possible overall to improve the uniformity of the emission and the color impression of the emitted radiation of a component. In this context, "radiation" is understood to mean the superimposition of all the radiations emitted during operation, that is to say for example the superimposition of primary radiation and secondary radiation. The emitted radiation can have any color impression in the CIE diagram, for example a white color impression.

In accordance with a further embodiment, method steps (c) and (d) can be carried out multiply in succession. Method steps (b), (c) and (d) can also be carried out multiply in succession, wherein different compositions, for example comprising different luminescence conversion substances, can also be used. It is thereby possible to set the color impression of the emitted radiation particularly finely.

In accordance with a further embodiment, in method step (c), the composition is applied into a recess of the substrate. The semiconductor element can, in particular, be arranged in the recess and/or form a bottom of the formation.

In accordance with a further embodiment, the composition applied in method step (c) has a meniscus. Such a meniscus can be formed for example by interactions, for example adhesion effects, of the composition with the side walls of a recess. Therefore, the luminescence conversion substance layer formed can also have a slightly concave edge. This can be proved for example on the basis of micrographs through the substrate with the luminescence conversion substance layer and subsequent evaluation by means of a microscope.

Such a meniscus may occasionally be formed only weakly if the luminescence conversion substance layer has a very high density. Embodiments, in which no meniscus can be demonstrated, are also conceivable, for example if the luminescence conversion substance layer comprises only little matrix material.

In accordance with a further embodiment, in method step (c), the composition is directly applied to the semiconductor element.

In this application, the fact that a first layer, a first region or a first device is arranged or applied "on" a second layer, a second region or a second device can mean in this case that the first layer, the first region or the first device is arranged or applied directly in direct mechanical and/or electrical contact on the second layer, the second region or the second device or with respect to the two further layers, regions or devices. Furthermore, an indirect contact can also be designated, in which further layers, regions and/or devices are arranged between the first layer, the first region or the first device and the second layer, the second region or the second device or the two further layers, regions or devices.

Consequently, the luminescence conversion substance layer can also be formed directly on the semiconductor element. In this case, the luminescence conversion substance layer has, in particular, a good adhesion on the surface of the semiconductor element, so that the use of adhesives can be dispensed with. The luminescence conversion substance layer can be connected to the semiconductor element in a positively locking manner and/or in a force-locking manner and/or material bonded manner, which is effected in particular by means of the matrix material. The luminescence conversion substance layer can uniformly cover the exposed areas of the semiconductor element, as a result of which the advantages already described are obtained.

Since the exposed areas of the semiconductor element are covered with luminescence conversion substance more uniformly than according to the prior art, locations or areas with inadequate conversion of the primary radiation are reduced in size or entirely avoided. Therefore, in comparison with conventional components in which, for example, a luminescence conversion substance element is arranged with an adhesive layer on a semiconductor element, the radiation can be emitted more uniformly. In contrast to that, such an adhesive layer can act like an optical waveguide and couple out radiation. The latter is then converted, however, only inadequately or not at all, as a result of which a non-uniform color impression of the emitted radiation arises (so-called blue-piping).

If the luminescence conversion substance layer is formed directly on the semiconductor element, the heat generated by radiation conversion can be released via the semiconductor element and dissipated better than is the case for a conventional arrangement with an adhesive layer between semiconductor element and luminescence conversion substance element. As a result, the conversion efficiency of the luminescence conversion substance can be improved since the latter generally has a higher efficiency at low temperatures than at higher temperatures. The semiconductor element can thus be operated at higher currents, for example.

In accordance with a further embodiment, the semiconductor element, in the substrate provided in method step (a) has a reflective material at its lateral areas. As a result, only a main area of the semiconductor element can be exposed, such that the luminescence conversion substance layer formed in method step (d) is produced only on said main area. Consequently, the primary radiation is emitted only or at least principally through said main area of the semiconductor element, which can lead to an again improved color constancy and more uniform emission.

By way of example, $TiO_2$, $ZrO_2$, $Al_2O_3$, glass, $SiO_2$ particles and combinations of these materials can be used as reflective materials. These materials can be arranged either directly or for example in a matrix of a glass or a polymer material.

By way of example, the semiconductor element can be arranged, as already explained, in a recess of the substrate and a planar area comprising the main area of the semiconductor element can be produced with the reflective material. As a result, the luminescence conversion substance layer can be formed with improved uniformity.

In accordance with a further embodiment, the substrate provided in method step (a) has a recess, the lateral boundaries of which form structures, which comprise or consist of a photoresist. In method step (c), the composition can be applied into said recess. The lateral boundaries can be shaped such that the bottom of the recess is at least partly formed by the semiconductor element or a main area of the semiconductor element. This enables, in particular, a uniform formation of the luminescence conversion substance layer directly on the semiconductor element.

In accordance with a development of this embodiment, in a further method step (e), the structures comprising a photoresist are removed. This can be done by irradiation, for example with UV radiation, such that the photoresist can easily be removed afterwards, for example using a solvent. The regions in which the photoresist was removed have few or even no residues of the composition or of the luminescence conversion substance layer, such that the semiconductor element can be divided well in these regions.

By way of example, chips, which have a luminescence conversion substance layer according to at least one embodiment of the invention on a main area, can thus be produced from the semiconductor element. In particular, a plurality of such semiconductor chips which emit radiation having a desired, for example white, color impression during operation can be produced in parallel in this way. By way of example, these semiconductor chips can be used in components, such that a further step for applying luminescence conversion substances can be dispensed with, as a result of which the production of the components is simplified and the production costs are reduced.

In accordance with a further embodiment, in method step (d), a semiconductor chip, which emits with a white color impression, is obtained from the semiconductor element and the luminescence conversion substance layer. A plurality of such semiconductor chips, which emit with a white color impression, can also be produced in parallel, as described above.

In accordance with a further embodiment, the composition has a viscosity of <1 Pa*s during application in method step (c). During application in method step (c), the composition can have a viscosity of ≤100 mPa*s and in particular of ≤50 mPa*s, for example <20 mPa*s. The viscosity indicates here the dynamic viscosity of the composition and is determined using a rheometer.

As a result of the low viscosity of the composition, the areas on which the composition is applied are wetted uniformly. In particular, (relatively small) unevennesses are compensated for thereby. The low viscosity is also manifested in a low surface tension of the composition. A further advantage is that sedimentation of the luminescence conversion substance or of the particles, which contain or consist of the luminescence conversion substance, is effected particularly uniformly and in general can also be effected to an appreciable extent. As a result, in method step (d), a particularly uniform luminescence conversion substance layer is formed on the substrate. Furthermore, such a composition can be readily handled and dosed.

In accordance with a further embodiment, the composition provided in method step (b) is embodied such that it can be applied via a needle-shaped outlet having an opening diameter of ≤1 mm, in particular 0.1 to 0.5 mm.

A reduction of the viscosity can also be achieved, besides the choice of the components of the composition, by heating the composition during or before method step (c). In addition or as an alternative thereto, the composition can be stirred, shaken and/or pressed through a needle, as a result of which the composition is sheared. On account of the shear, the viscosity decreases.

In accordance with a further embodiment, in method step (d), a luminescence conversion substance layer is formed, which has a layer thickness of ≤60 μm, in particular of ≤50 μm and often of ≤40 μm. That means that the luminescence conversion substance layer formed generally has a smaller layer thickness than it is the case for conventional luminescence conversion substance elements, which in the regular case have layer thicknesses of ≥80 μm. In consequence, with the luminescence conversion substance layer in accordance with the application, it is also possible to realize smaller components or components having a smaller height, and it is possible to improve the heat dissipation over the semiconductor element.

In accordance with a further embodiment, in method step (d), a luminescence conversion substance layer is formed which has a content of luminescence conversion substance of ≥50 wt % (wt %=percent by weight). The content of luminescence conversion substance can be ≥75 wt %, and in particular ≥85 wt %, for example 90 wt %. The indication relates to the complete mass of the luminescence conversion substance layer. Even with a high content of luminescence conversion substance, the luminescence conversion substance layer can adhere well on the substrate or on the semiconductor element. In particular, the materials are chosen such that, independently of the specific content in wt %, a luminescence conversion substance layer is formed which has >35% vol., in particular >45% vol., for example 50% vol., of luminescence conversion substance (% vol.=percent by volume).

Advantages of such a high luminescence conversion substance concentration are, for example, a good thermal conductivity. Thus, the emitted heat of the semiconductor element and, in particular, the heat formed by conversion can be better dissipated by the luminescence conversion substance layer. An improved heat dissipation also leads to a higher conversion efficiency. In addition, the color homogeneity of the radiation emitted by a component is also increased.

Since the composition used for producing the luminescence conversion substance layer contains a solvent, the luminescence conversion substance, after at least partial removal of the solvent, can be present in the luminescence conversion substance layer in higher concentrations than it is the case for conventional layers or elements. Therefore, in accordance with the application, the luminescence conversion substance layer can be formed such that it has a denser packing of luminescence conversion substance than according to the prior art. The luminescence conversion substance can at least partly form a densest packing in the matrix material.

In accordance with a further embodiment, the luminescence conversion substance layer formed in method step (d) has a content of matrix material of ≤50 wt %. The content of matrix material can be ≤25 wt %, and in particular ≤15 wt %, for example 10 wt %. The luminescence conversion substance layer can therefore be formed substantially or completely from luminescence conversion substance and matrix material.

In accordance with a further embodiment, the composition is applied such that, before and/or during method step (d), the luminescence conversion substance is sedimented within 60 min, and in particular within 30 min, for example within 15 min. In general, a partial or complete sedimentation of the luminescence conversion substance is effected within this time period. Afterwards and/or in the meantime, the solvent can be at least partly removed.

In accordance with a further embodiment, in method step (d), the solvent is removed at elevated temperature and/or at reduced pressure and/or by means of irradiation. An elevated temperature means a temperature above room temperature (25° C.), such that the solvent can be removed more easily or more rapidly.

In accordance with a development of this embodiment, in method step (d), the solvent is removed at a temperature of between 40 and 160° C., and in particular between 40 and 80° C., for example at 60° C.

In accordance with a development of this embodiment, in method step (d), the solvent is removed at a pressure of between 0.5 and 800 mbar, and in particular between 1 and 100 mbar, for example at 10 mbar. The removal of the solvent is accelerated by a reduced pressure.

In accordance with a development of this embodiment, in method step (d), in order to remove the solvent, irradiation is effected by means of a radiation. The radiation can be a beta radiation or a gamma radiation, for example. It is also possible to use a UV radiation or an infrared radiation. In principle, microwaves can also be used for irradiation or heating. The radiation used for irradiation does not correspond to the radiation emitted during the operation of the semiconductor element.

It is possible, in any desired combinations for at least partial removal, to heat the solvent in method step (d) and/or to apply a reduced pressure and/or to irradiate with radiation. In general, the solvent is substantially removed in method step (d), with the result that the luminescence conversion substance layer has only a low or even no residual content of solvent.

In accordance with a further embodiment, the luminescence conversion substance layer formed in method step (d) contains a residual content of up to 5 wt % of solvent, and in particular of up to 3 wt % of solvent, typically 1 to 2 wt %. A small residual content of solvent can be used to improve the adhesion of the luminescence conversion substance layer on the substrate or on the semiconductor element. The solvent can therefore act as an adhesion promoter. The residual content of solvent in the luminescence conversion substance layer can be determined by means of solid-state nuclear magnetic resonance spectroscopy (solid-state NMR).

In accordance with a further embodiment, in method step (d), a luminescence conversion substance layer is formed in which the concentration of the luminescence conversion substance in a matrix, which comprises or consists of the matrix material, has a gradient. Said gradient can be formed for example as a consequence of the sedimentation of the luminescence conversion substance.

Such a gradient can be formed in such a way that in those regions of the luminescence conversion substance layer formed which face the substrate or the semiconductor element, a higher concentration of luminescence conversion substance is present than is the case in the regions facing away. The gradient can be linear, for example. A gradient can be utilized for a gradually varying effective refractive index. By way of example, it is possible to reduce the refractive index difference (so-called index-jump) between semiconductor element and luminescence conversion substance relative to a potting compound composed of silicone optionally arranged thereon or relative to a gas atmosphere, so that the coupling-out of radiation is improved.

In accordance with a further embodiment, the composition provided in method step (b) contains 2 to 50 wt %, and in particular 5 to 30 wt %, of luminescence conversion substance alongside matrix material and solvent. During the at least partial removal of the solvent in method step (d), the proportion of luminescence conversion substance is increased until the solvent is removed to a sufficient extent and the luminescence conversion substance layer is formed.

In accordance with a further embodiment, the particles of the luminescence conversion substance in the composition provided in method step (b) have an average diameter of ≤20 μm, and in particular of ≤10 μm. As a result, it is possible to realize smaller layer thicknesses in comparison with conventional luminescence conversion elements. However, the particle size is not particularly limited in the method. By way of example, it is also possible to use very small particles, which would not sediment in a conventional method without solvent. The average particle diameters can be determined by means of a screening method.

In accordance with a further embodiment, at least 95 wt %, and in particular at least 99 wt %, of the particles of the luminescence conversion substance in the composition provided in method step (b) have a maximum diameter of ≤20 μm, and in particular of ≤15 μm.

In accordance with a further embodiment, at least 95%, and in particular at least 99%, of the particles of the luminescence conversion substance in the composition provided in method step (b) have a minimum diameter of ≥2 μm, and in particular of ≥5 μm. Smaller particles can be separated beforehand, for example, by means of a screening method. Radiation can be substantially scattered in particular at small particles, for example having a diameter of up to 2 μm. Consequently, the transmission is therefore improved since fewer radiation losses occur in the luminescence conversion substance layer.

In accordance with a further embodiment, the composition provided in method step (b) contains 5 to 25 wt % of matrix material. The composition can contain ≤15 wt %, for example 10 wt %, of matrix material.

In accordance with a further embodiment, the matrix material in the composition provided in method step (b) is selected from: silicone, epoxy resin, acrylic resin, precursor of these polymer compounds and combinations of the materials mentioned. Herein, combinations also include hybrid materials. A combination of silicone and epoxy resin, for example, can therefore also be a silicone-epoxy hybrid material. If the matrix material contains or consists of precursor of polymer compounds, the latter can be at least partly cross-linked in method step (d) during the formation of the luminescence conversion substance layer. The cross-linking can be effected by curing, for example by means of heating and/or irradiation with the radiations already mentioned above. This can be done simultaneously and/or after the removal of the solvent. The matrix material is, in particular, transparent to the primary radiation and also to the secondary radiation, such that only few radiation losses occur on account of the matrix material in the luminescence conversion substance layer.

In accordance with a further embodiment, the matrix material in the composition provided in method step (b) is a silicone. The silicone can contain or consist of a commercially available silicone, in particular polydialkylsiloxane, polydiarylsiloxane, polyalkylarylsiloxane or a combination thereof. Examples of such a silicone are poly(dimethylsiloxane), polymethylphenylsiloxane or a combination thereof.

In accordance with a further embodiment, the composition provided in method step (b) contains 30 to 95 wt %, in particular 50 to 75 wt %, for example 60 wt %, of solvent. Therefore, the composition generally has a significantly larger volume than the luminescence conversion substance layer formed in method step (d).

In accordance with a further embodiment, the solvent in the composition provided in method step (b) is suitable for dissolving the matrix material, and in particular a silicone.

In accordance with a further embodiment, the solvent in the composition provided in method step (b) is selected from: ester, ether, silyl ether, disiloxane, aliphatic, aromatic hydrocarbon, halogenated hydrocarbon and combinations of these solvents. In general, the solvent is volatile, and so it can readily be at least partly removed in method step (d). By way of example, the solvent can have a boiling point of ≤120° C. at atmospheric pressure (1013.25 mbar). Therefore, damage to the luminescence conversion substance layer need not be feared during the removal of the solvent; for damage usually occurs only if heating takes place for a long time above 200° C.

Low-molecular-weight compounds, which can be used as a precursor for polymer compounds, are usually not counted among the solvents, but rather among the matrix materials. Such low-molecular-weight compounds are, for example, acrylic acid and methacrylic acid derivatives, epoxides, olefins, isocyanates and similar polymerizable compounds. What is essential in any case is that the solvent is at least partly removed in method step (d), for example to the extent of ≥90% vol., and in particular ≥95% vol. (% vol.=percent by volume).

In accordance with a further embodiment, the solvent in the composition provided in method step (b) is a disiloxane, for example hexamethyldisiloxane ($Me_3SiOSiMe_3$). This solvent has the advantage, in particular, that it can dissolve silicones very well, is comparatively volatile and can be used in low concentrations as an adhesion promoter in the luminescence conversion substance layer. Further typical solvents are toluene and benzene as aromatic hydrocarbons, which can be used alone or in combination with other solvents, for example hexamethyldisiloxane.

The composition provided in method step (b) can be formed for example by mixing luminescence conversion substance, matrix material and solvent. In principle, it is possible to mix a conventional printing paste containing luminescence conversion substance, such as is used for printing luminescence conversion elements, with a solvent and thereby to obtain a composition according to at least one embodiment of the invention.

In accordance with a further embodiment, a potting compound is arranged on the substrate provided in method step (a). Thus, the luminescence conversion substance layer is not arranged directly on the semiconductor element. Said potting compound can be arranged for example in the beam path of the primary radiation and/or in the beam path of a radiation partly converted by a further, second luminescence conversion substance. Said second luminescence conversion substance can be arranged in a distributed manner for example, in a conventional element, in a luminescence conversion substance layer according to at least one embodiment of the invention, or in the potting compound. The luminescence conversion substances already described can be used as the second luminescence conversion substance. In method step (d), the luminescence conversion substance layer can also be formed as an element for so-called remote phosphor conversion on the potting compound. No second luminescence conversion substance is required in this case. Remote phosphor conversion is understood to mean radiation conversion that is effected at a large distance from the radiation source, for example >750 μm.

In general, in accordance with this embodiment, in method step (c), the composition is directly applied to the potting compound. In particular, the color impression of the radiation can be regulated very finely as a result. In this case, the uniformity of the emission is often improved as well.

It is therefore possible, for example, to provide as substrate in method step (a) a radiation-emitting component comprising a radiation-emitting semiconductor element and also a second luminescence conversion substance and a potting compound, to determine the color impression of the radiation emitted by the component and subsequently to adjust it by means of a luminescence conversion substance layer formed according to at least one embodiment of the invention on the potting compound. This can be carried out individually for each component or each substrate.

In accordance with a development of this embodiment, in method step (d), a luminescence conversion substance layer is formed in which the concentration of luminescence conversion substance decreases towards the lateral sides. Thus, the concentration of luminescence conversion substance is higher in the center of the luminescence conversion substance layer formed, as a result of which a higher conversion is effected there.

In conventional components, the color point of the radiation can be dependent on the angle θ with respect to the main emission direction (θ=0°) of the radiation. This means that the radiation is emitted with a non-uniform color impression. With the method according to at least one embodiment of the invention, a luminescence conversion substance layer can be formed in such a way that such an inconstant color impression is at least partly compensated. By way of example, it is possible to produce a thin luminescence conversion substance layer on a potting compound, in said luminescence conversion substance layer, the concentration of luminescence conversion substance has a gradient. The concentration can, in particular, be higher in the main emission direction than at an angle with respect to the main emission direction. As a result, a dependence of the color impression on the angle θ can be at least partly reduced, as a result of which overall a more uniform color impression is obtained.

In accordance with a development of this embodiment, the luminescence conversion substance layer formed in method step (d) has a layer thickness of ≤30 μm, for example 20 μm. Such a thin luminescence conversion substance layer will therefore convert a smaller proportion of the incident radiation in comparison with a thicker layer. Consequently, the color point of the radiation can be adjusted very finely, which is of importance in particular in an embodiment of the invention, in which the composition is applied to a potting compound in method step (c).

In accordance with a development of this embodiment, in method step (d), a luminescence conversion substance layer is formed in which at least 85% of the particles of the luminescence conversion substance are arranged as a monolayer or submonolayer. By way of example, the concentration of luminescence conversion substance can be increased in the region of the main emission direction of a component. In this region, more than one layer of luminescence conversion substance particles can be present. A demonstration of the particle arrangement in the luminescence conversion substance layer can be determined by means of micrographs and subsequent analysis by SEM.

In accordance with the application, a composition for producing a luminescence conversion substance layer is also specified, comprising:
a luminescence conversion substance,
a matrix material and
a solvent.

The composition can also consist of these materials. The composition can be used in particular for a method in accordance with at least one embodiment of the invention, in order to produce a luminescence conversion substance layer on a substrate or on a semiconductor element. The composition can therefore have the properties as already described above.

In accordance with the application, a component is also specified, which contains a semiconductor element that emits a primary radiation during operation, and a luminescence conversion substance layer arranged in the beam path of the emitted primary radiation, said luminescence conversion substance layer can be produced or is produced according to the method in accordance with at least one embodiment of the invention. Consequently, the radiation emitted by the component has, in particular, a uniform color impression.

The component can comprise the customary constituents of an optoelectronic component such as, for example, electrical leads, a leadframe, a bond pad, a bond wire, solder compound, etc. A recess of the component can be at least partly filled with a potting compound.

The semiconductor element can comprise, for example, a thin-film light-emitting diode chip which is distinguished, in particular, by the following characteristic features:

a reflective layer is applied or formed at a first main area, which faces towards a carrier element, of a radiation-generating epitaxial layer sequence, said reflective layer reflecting at least part of the electromagnetic radiation generated in the epitaxial layer sequence back into the latter;

the epitaxial layer sequence has a thickness in the range of 20 μm or less, in particular in the range of 10 μm and often in the range of 2 μm; and the epitaxial layer sequence contains at least one semiconductor layer with at least one area having an intermixing structure, which ideally leads to an approximately ergodic distribution of the radiation in the epitaxial layer sequence, that is to say that it has as far as possible ergodically stochastic scattering behavior.

A basic principle of a thin-film light-emitting diode chip is described, for example, in I. Schnitzer, et al., Appl. Phys. Lett. 63 (16), 18 Oct. 1993, pages 2174-2176, the disclosure content of which in this respect is hereby incorporated by reference.

BRIEF DESCRIPTION OF THE DRAWINGS

The invention is explained in greater detail below on the basis of exemplary embodiments and drawings. Herein, identical reference symbols in each case indicate identical elements in the individual figures. However, references to scale are not illustrated; rather, individual elements may be illustrated in an enlarged fashion and/or schematically in order to afford better understanding.

DETAILED DESCRIPTION OF ILLUSTRATIVE EMBODIMENTS

Figure 1A:
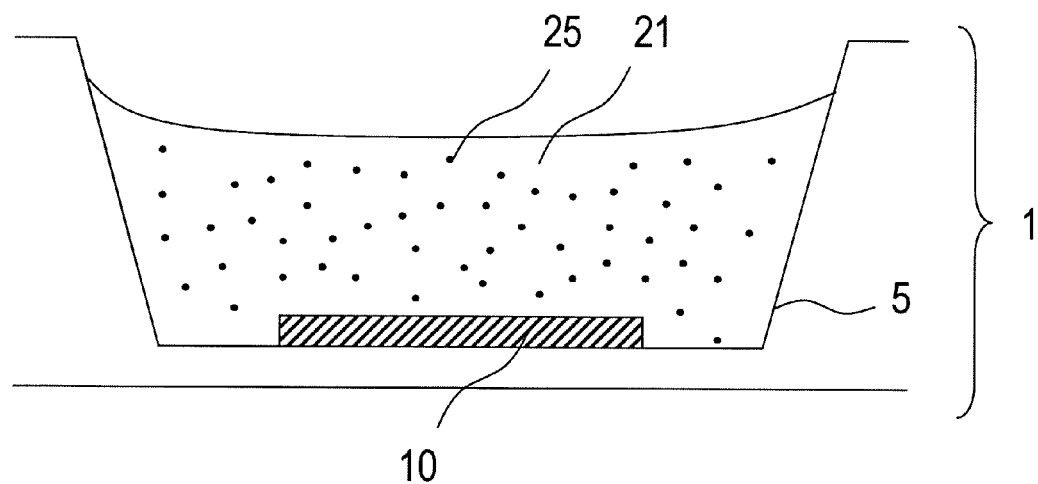
FIGS. 1a to 1c show several method steps of a method in accordance with at least one embodiment of the invention.
Figure 1B:
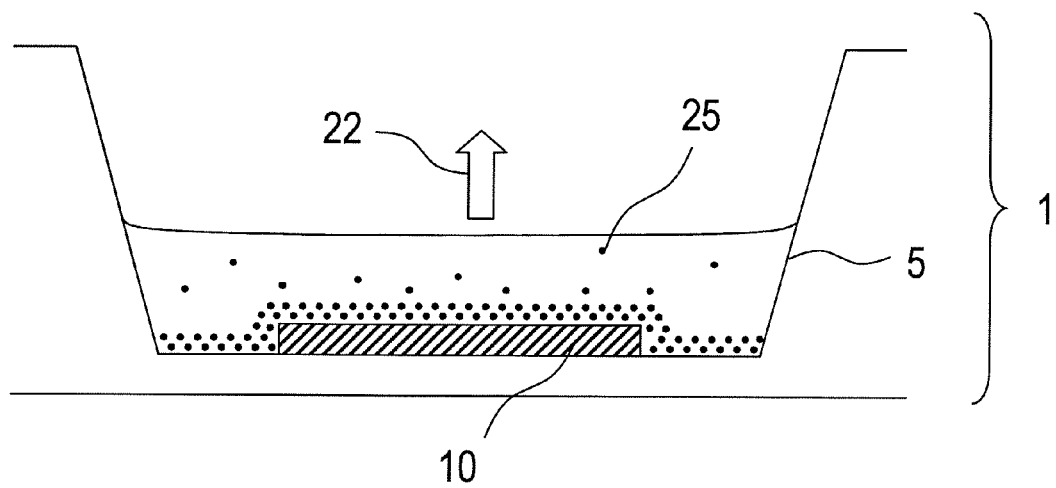
Figure 1C:
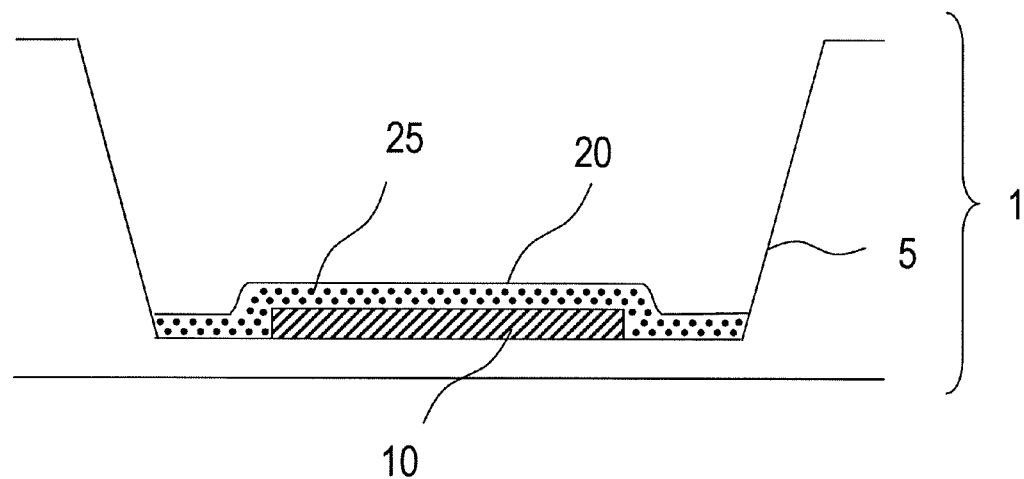

FIGS. 1a to 1c show a cross section through a substrate 1 comprising a recess 5, for example in a housing of plastic or ceramic, and a semiconductor element 10, which can emit a primary radiation during operation and is arranged in the recess 5. The housing can contain reflective materials (not shown). Furthermore, the substrate 1 can comprise the customary constituents of an optoelectronic component such as, for example, electrical leads, a leadframe, a bond pad, a bond wire, solder compound, etc. (not shown for the sake of clarity), such that an optoelectronic component can be produced from the substrate.

FIG. 1a shows, inter alia, a composition 21 according to at least one embodiment of the invention, which was applied to the substrate 1 in a method step (c). In this case, the composition 21 was applied into the recess 5 and directly to the substrate 1 and to the semiconductor element 10, respectively. The composition 21 contains 2 to 50 wt %, for example 30 wt %, of luminescence conversion substance particles 25. Furthermore, the composition 21 contains 5 to 25 wt %, for example 10 wt %, of matrix material, for example a silicone, and also 50 to 75 wt %, for example 60 wt %, of solvent. Hexamethyldisiloxane can be used as solvent.

FIG. 1b shows a moment of a method step (d) according to at least one embodiment of the invention, where a large proportion of the luminescence conversion substance 25 has already sedimented and part of the solvent has been removed, or is currently being removed, which is indicated by the arrow 22. It is also possible firstly for the luminescence conversion substance 25 to be (completely) sedimented and afterwards for the solvent to be at least partly removed (not shown).

FIG. 1c shows a concluded method step (d) according to at least one embodiment of the invention. A luminescence conversion substance layer 20, which is also designated hereafter as "layer 20," has been uniformly produced directly on the exposed areas of the semiconductor element 10 and on the substrate 1, respectively. The concentration of luminescence conversion substance 25 in the matrix material of the layer 20 is higher in the regions, which adjoin the semiconductor element 10 and the substrate 1, respectively, than in the regions of the layer 20 that face away, with the result that a gradient is present. The layer 20 has been produced particularly uniformly on the semiconductor element 10, with the result that radiation can be emitted uniformly with a uniform color impression during operation. By way of example, so-called blue-piping is thus avoided. The layer 20 formed generally has at least 75 wt %, in particular 85 wt %, for example 90 wt %, of luminescence conversion substance 25. Furthermore, the layer 20 can contain at most 25 wt %, in particular at most 15 wt % such as for example 9 wt %, of matrix material and also 1 to 2 wt %, for example 1 wt %, of solvent.

The substrate 1, on which a luminescence conversion substance layer 20 is produced according to at least one embodiment of the invention, can be used for producing a component. By way of example, a conventional potting compound, for example composed of a silicone or an epoxy resin, can be arranged on the layer 20 and, if appropriate, shaped as a lens (not shown). Such a component can emit radiation with any desired color impression, for example white.

Figure 2:
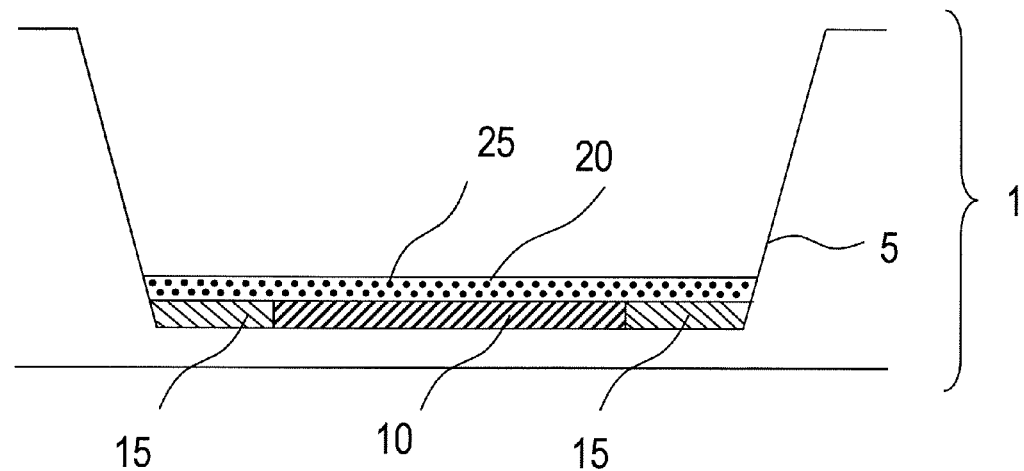
FIG. 2 shows a further substrate, on which a luminescence conversion substance layer according to one embodiment of the invention is formed.

FIG. 2 shows a further embodiment of the invention, in which the substrate 1 for example from FIG. 1a additionally has a layer 15, which comprises or consists of reflective materials such as $TiO_2$, for example. By way of example, the semiconductor element 10 and also the layer 15 can form a planar or virtually planar (which includes deviations of ≤15 μm) area. In this example, a layer 20 is produced directly on the semiconductor element 10 and on the substrate 1, respectively.

Figure 3A:
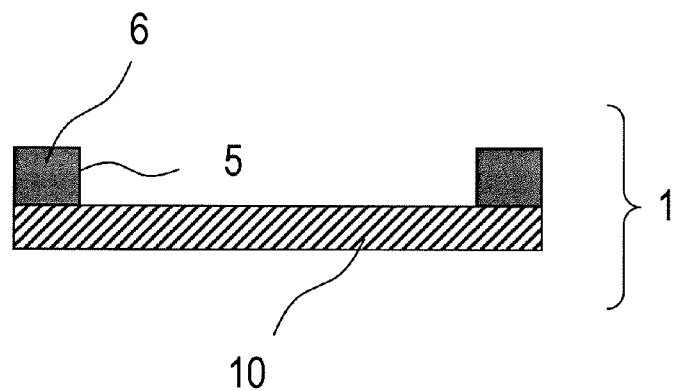
FIGS. 3a to 3d show further embodiments of the invention.

FIG. 3a shows a substrate 1 as is provided according to at least one embodiment of the invention in a method step (a). The substrate 1 can be a semiconductor element 10, on which structures 6 are formed. The structures 6 can be arranged directly on the semiconductor element 10 and comprise or consist of a photoresist. The structures 6 and the semiconductor element 10 form a recess 5, for example, wherein the bottom of the recess 5, as shown, can be formed by the semiconductor element 10.

Figure 3B:
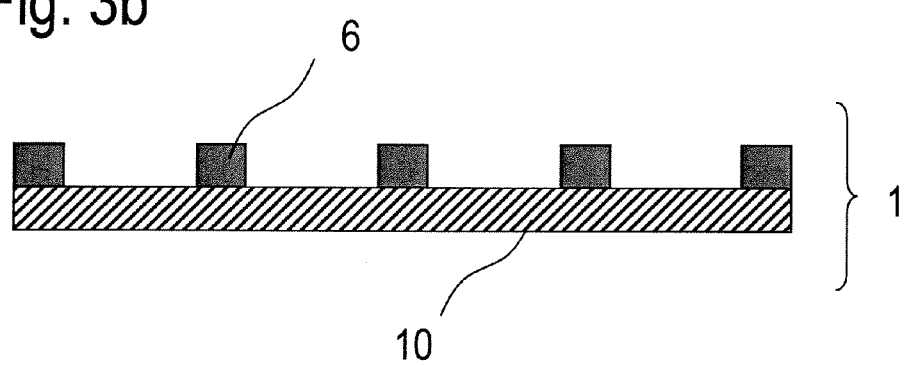

The substrate 1 in FIG. 3a can be for example an excerpt from a substrate 1, as is shown in FIG. 3b, which comprises a plurality of recesses 5, such that according to at least one embodiment of the invention a plurality of luminescence conversion substance layers 20 can be produced in parallel thereon.

Figure 3C:
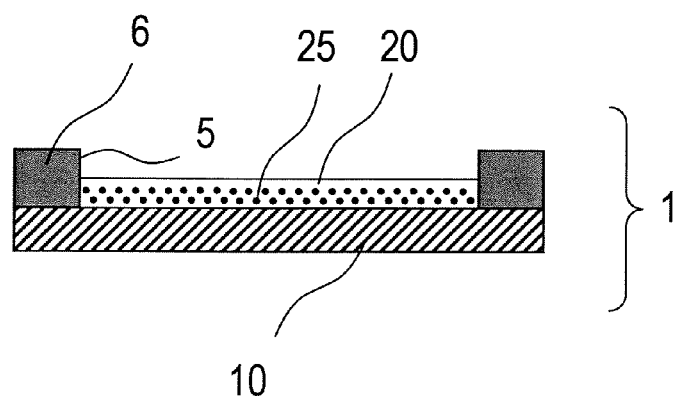

FIG. 3c shows a substrate 1 from FIG. 3a and/or FIG. 3b, on which the layer 20 is produced directly on the substrate 1 or the semiconductor element 10. The layer 20 is formed particularly uniformly.

Figure 3D:
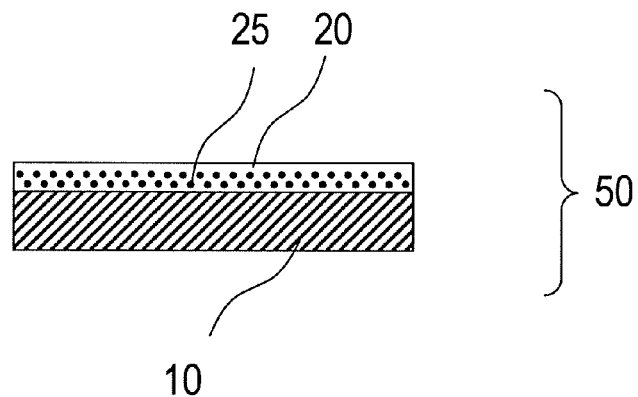

FIG. 3d shows a component, a semiconductor chip 50, which was produced according to a method step (e) from the substrate 1 with a layer 20, as shown in FIG. 3c. For this purpose, the structures 6 were irradiated with UV radiation and subsequently removed. The semiconductor element 10 was divided, for example by sawing, at least some of the now uncoated locations.

The semiconductor chip 50 comprises a semiconductor element 10 having a layer 20 according to at least one embodiment of the invention on a main area. Consequently, the semiconductor chip 50 can emit radiation with any desired color impression, for example white, during operation. The semiconductor chip 50 is suitable in particular for being inserted into an optoelectronic component, which therefore requires no further luminescence conversion substances in order to emit radiation with a desired color impression during operation. As a result, in particular, the production of said optoelectronic component can be simplified, as a result of which the production costs can be lowered.

Figure 4A:
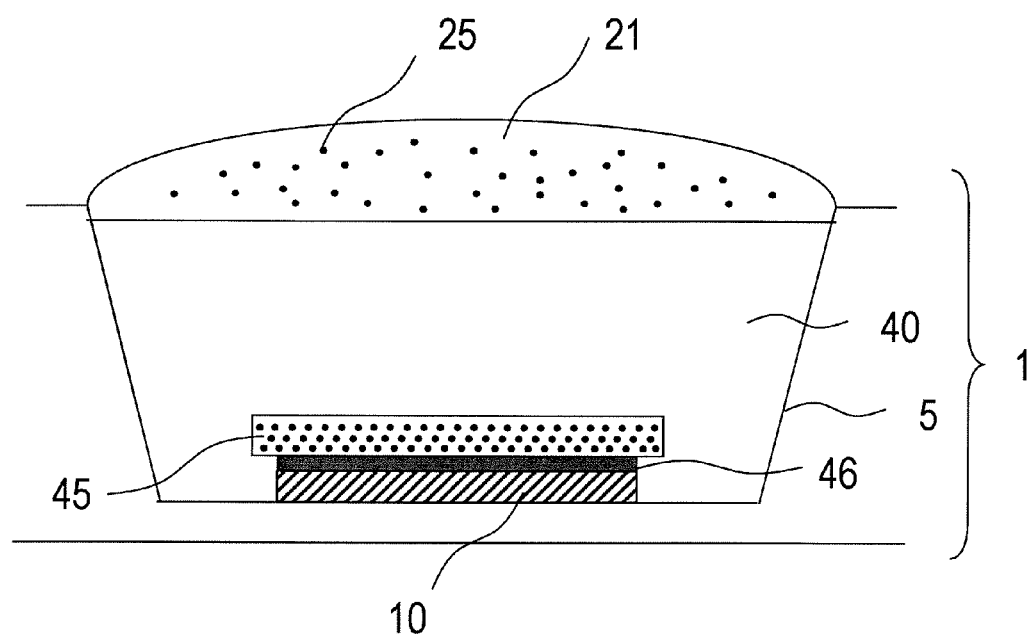
FIGS. 4a to 4d show further embodiments of the invention, in which the composition is formed on a potting compound.

FIG. 4a shows a composition 21 according to at least one further embodiment of the invention, which is applied directly to a potting compound 40 of a substrate 1. The recess 5 can project beyond the potting compound 40 somewhat at the sides. The potting compound 40 can, for example, also be embodied convexly or concavely (not shown). The substrate 1 comprises, for example, a semiconductor element 10 and also a second (conventional) luminescence conversion substance element 45, which is arranged with a layer 46 composed of adhesive on the semiconductor element 10. Instead of the second luminescence conversion substance element 45, the substrate 1 can also have a luminescence conversion substance layer 20 such as can be produced according to at least embodiment of the invention. The substrate 1 can comprise further constituents, which are required for an optoelectronic component, as has already been explained above. The substrate 1 can be for example an optoelectronic component, which emits radiation with a color impression that is intended to be adjusted.

Figure 4B:
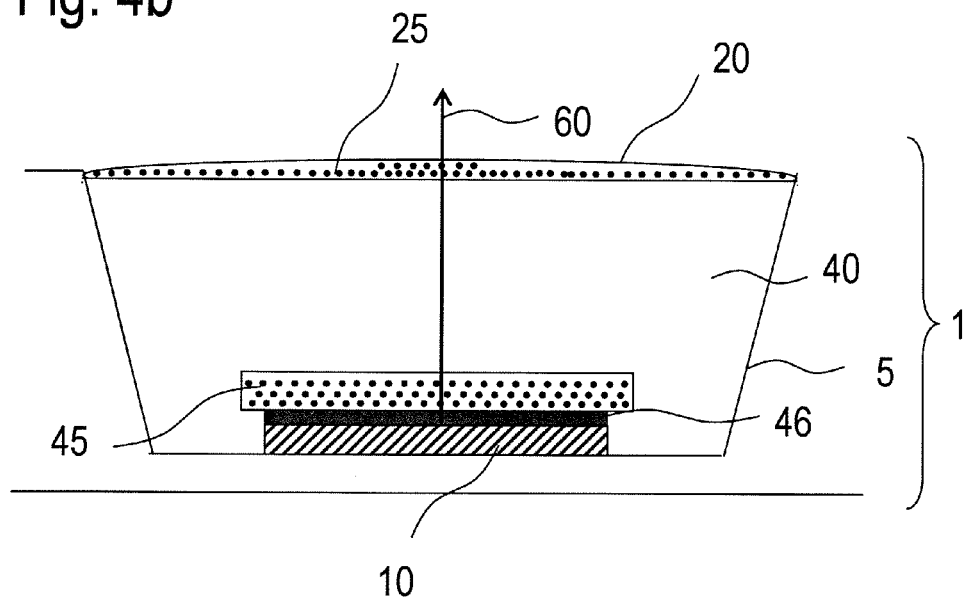

FIG. 4b shows how a luminescence conversion substance layer 20 according to at least one embodiment of the invention is formed on the substrate 1 from FIG. 4a in a method step (d). In this case, the layer 20 has a layer thickness of ≤30 μm, for example 20 μm, such that only a slight conversion is effected, which can be used for adjusting the color impression of an emitted radiation. In the layer 20, at least 85% of the particles of the luminescence conversion substance 25 are arranged in a monolayer or submonolayer, wherein the concentration is higher in the region of the main emission direction (θ=0°), which is represented by the arrow 60, than in other regions of the layer 20.

Figure 4C:
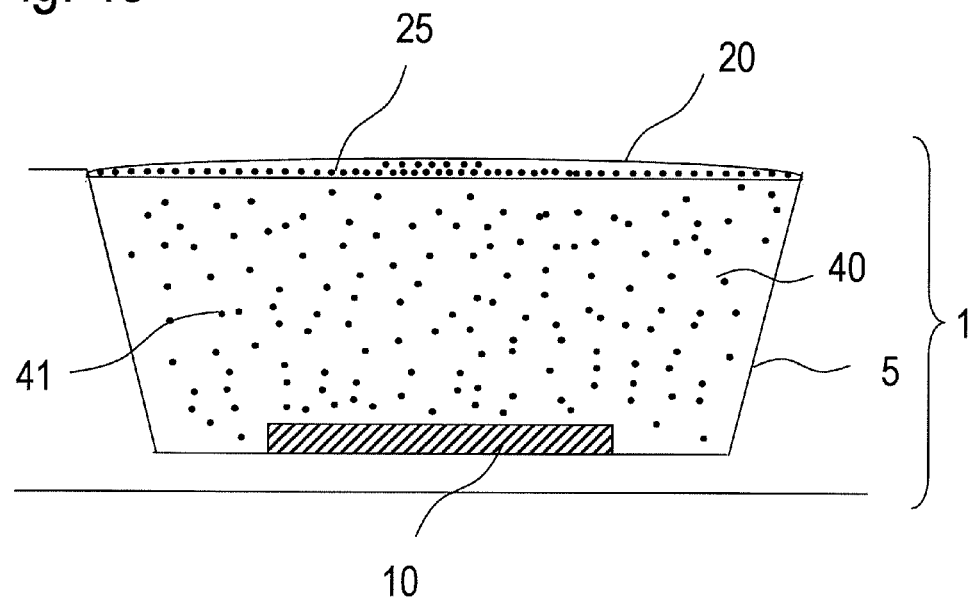

FIG. 4c shows a further component, in which a luminescence conversion substance layer 20 according to at least one embodiment of the invention is produced directly on a potting compound 40. In this case, the luminescence conversion substance layer 20 can correspond to the layer 20 from FIG. 4b. In this case, no second (conventional) luminescence conversion substance element 45 is arranged on the semiconductor element 10, rather particles 41 which contain or consist of a second luminescence conversion substance are distributed in the potting compound 40.

Figure 4D:
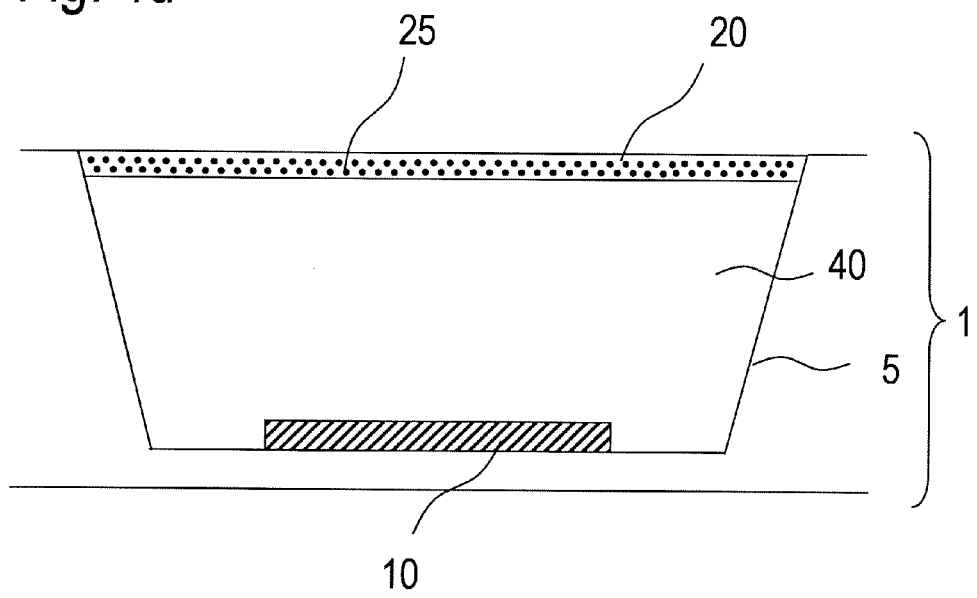

FIG. 4d shows a further component, which comprises a luminescence conversion substance layer 20 formed according to at least one embodiment of the invention. No further luminescence conversion substances are present in this case, since the luminescence conversion substance layer 20 is formed as an element for so-called remote phosphor conversion for example directly on a potting compound 40.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

The invention claimed is:

1. A method for producing a luminescence conversion substance layer on a substrate with a semiconductor element emitting a primary radiation during operation, the method comprising:
   providing the substrate;
   providing a composition comprising a luminescence conversion substance, a matrix material and a solvent;
   applying the composition to the substrate; and
   removing at least a part of the solvent, so that the luminescence conversion substance layer is formed on the substrate, the luminescence conversion substance layer having a layer thickness that is equal to, or less than, 60 μm;
   wherein applying the composition comprises applying a composition with a viscosity of <1 Pa*s during application;
   wherein applying the composition comprises first completely applying the composition into a recess of the substrate or a recess on the substrate and afterward removing at least a part of the solvent; and
   wherein before or during removing the solvent, the luminescence conversion substance sediments such that the luminescence conversion substance layer is formed, and the concentration of the luminescence conversion substance, in a matrix comprising the matrix material, has a gradient.

2. The method according to claim 1, wherein applying the composition comprises directly applying the composition to the semiconductor element.

3. The method according to claim 1, wherein applying the composition comprises applying a composition with a viscosity of <50 mPa*s during application.

4. The method according to claim 1, wherein a luminescence conversion substance layer is formed which has a layer thickness of ≤50 μm.

5. The method according to claim 1, wherein a luminescence conversion substance layer is formed, which has a content of luminescence conversion substance of ≥75 wt %.

6. The method according to claim 1, wherein a luminescence conversion substance layer is formed, which has a content of luminescence conversion substance of ≥85 wt %.

7. The method according to claim 1, wherein the composition contains 2 to 50 wt % of luminescence conversion substance.

8. The method according to claim 1, wherein the composition contains 5 to 30 wt %, of luminescence conversion substance.

9. The method according to claim 1, wherein, in the composition at least 95 wt % of the particles of the luminescence conversion substance have a maximum diameter of ≤20 μm.

10. The method according to claim 1, wherein, in the composition at least 95 wt % of the particles of the luminescence conversion substance have a maximum diameter of ≤15 μm.

11. The method according to claim 1, wherein the composition contains 5 to 25 wt % of matrix material.

12. The method according to claim 1, wherein in the composition, the matrix material comprises a material selected from the group consisting of silicone, epoxy resin, acrylic resin, precursors of these polymer compounds and combinations of the materials mentioned.

13. The method according to claim 1, wherein in the composition, the solvent comprises a solvent selected from the group consisting of ester, ether, silyl ether, disiloxane, aliphatic, aromatic hydrocarbon, halogenated hydrocarbon and combination of the solvents mentioned.

14. The method according to claim 1, further comprising forming a potting compound on the substrate.

15. A method for producing a luminescence conversion substance layer on a substrate with a semiconductor element emitting a primary radiation during operation, the method comprising:
(a) providing the substrate, wherein the semiconductor element has a reflective material at its lateral areas so that only a main area of the semiconductor element is exposed and so that the reflective material together with the main area forms a planar area;
(b) providing a composition comprising a luminescence conversion substance, a matrix material and a solvent;
(c) applying the composition to the exposed main area of the semiconductor element; and;
(d) removing at least a part of the solvent, so that the luminescence conversion substance layer is formed on the substrate, the luminescence conversion substance layer having a layer thickness of ≤60 μm;
wherein applying the composition comprises applying a composition with a viscosity of <1 Pa*s during application,
wherein the finished luminescence conversion substance layer formed in method step (d) contains a residual content of up to 5 wt % of the solvent, and
wherein, before or during removing the solvent, the luminescence conversion substance sediments such that the luminescence conversion substance layer is formed, and the concentration of the luminescence conversion substance, in a matrix comprising the matrix material has a gradient.

* * * * *